(12) United States Patent
Choi et al.

(10) Patent No.: US 10,811,478 B2
(45) Date of Patent: Oct. 20, 2020

(54) ORGANIC LIGHT-EMITTING DIODE DISPLAY DEVICE AND METHOD OF FABRICATING THE SAME

(71) Applicant: Samsung Display Co., Ltd., Yongin-si (KR)

(72) Inventors: Dae Won Choi, Cheonan-si (KR); Tae Wook Kang, Seongnam-si (KR); Kyeong Su Ko, Hwaseong-si (KR); Sang Gab Kim, Seoul (KR); Tae Sung Kim, Incheon (KR); Joon Geol Lee, Wanju-gun (KR); Hyun Min Cho, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/374,706

(22) Filed: Apr. 3, 2019

(65) Prior Publication Data
US 2020/0043998 A1    Feb. 6, 2020

(30) Foreign Application Priority Data
Jul. 31, 2018    (KR) .......................... 10-2018-0089247

(51) Int. Cl.
*H01L 27/00* (2006.01)
*H01L 51/52* (2006.01)
(Continued)

(52) U.S. Cl.
CPC ...... *H01L 27/3246* (2013.01); *H01L 51/5012* (2013.01); *H01L 51/5256* (2013.01); *H01L 2227/323* (2013.01)

(58) Field of Classification Search
CPC . H01L 51/5256; H01L 51/5012; H01L 51/56; H01L 51/5246; H01L 51/5228;
(Continued)

(56) References Cited

U.S. PATENT DOCUMENTS

| 8,664,659 | B2 | 3/2014 | Kang et al. |
| 9,466,648 | B2 | 10/2016 | Kim |

(Continued)

FOREIGN PATENT DOCUMENTS

| KR | 10-2015-0089435 | 8/2015 |
| KR | 10-2017-0092164 | 8/2017 |
| KR | 10-2018-0013225 | 2/2018 |

*Primary Examiner* — Nikolay K Yushin
(74) *Attorney, Agent, or Firm* — H.C. Park & Associates, PLC

(57) ABSTRACT

An organic light-emitting diode display device includes a pixel electrode, a pixel-defining layer, an organic emission layer, and a counter electrode. The pixel-defining layer includes an opening partially exposing the pixel electrode. The organic emission layer is disposed on the pixel electrode. The organic emission layer is disposed in the opening. The counter electrode is disposed on the organic emission layer. The counter electrode opposes the pixel electrode. The pixel-defining layer includes a first pixel-defining layer and a second pixel-defining layer. The first pixel-defining layer is disposed on the pixel electrode and includes an inorganic material. The second pixel-defining layer is disposed on the first pixel-defining layer and includes an organic material. A sidewall of the first pixel-defining layer that is closest to the opening is aligned with a sidewall of the second pixel-defining layer that is closest to the opening.

20 Claims, 11 Drawing Sheets

(51) Int. Cl.
*H01L 27/32* (2006.01)
*H01L 51/50* (2006.01)

(58) Field of Classification Search
CPC ............. H01L 51/3211; H01L 27/3246; H01L 27/3262; H01L 27/3258; H01L 27/1248; H01L 27/124; H01L 27/3248; H01L 2227/323

See application file for complete search history.

(56) References Cited

U.S. PATENT DOCUMENTS

| | | | |
|---|---|---|---|
| 9,614,180 B2* | 4/2017 | Kang | ................... H01L 27/3246 |
| 10,361,257 B2* | 7/2019 | Yang | ................... H01L 27/3246 |
| 2010/0102715 A1* | 4/2010 | Suh | ...................... H01L 27/3246 |
| | | | 313/504 |
| 2015/0014636 A1* | 1/2015 | Kang | ................... H01L 27/3258 |
| | | | 257/40 |
| 2017/0221982 A1 | 8/2017 | Park | |
| 2018/0190737 A1* | 7/2018 | Yang | ..................... H01L 51/105 |

* cited by examiner

ORGANIC LIGHT-EMITTING DIODE DISPLAY DEVICE AND METHOD OF FABRICATING THE SAME

CROSS-REFERENCE TO RELATED APPLICATION

This application claims priority from and the benefit of Korean Patent Application No. 10-2018-0089247, filed Jul. 31, 2018, which is hereby incorporated by reference for all purposes as if fully set forth herein.

BACKGROUND

Field

Exemplary embodiments generally relate to an organic light-emitting diode display device and a method of fabricating the same.

Discussion

An organic light-emitting diode (OLED) display device is a kind of self-luminous display device. An OLED display device typically includes an organic emission layer interposed between a pixel electrode and a counter electrode. Electrons and holes are injected into the emission layer from the two opposing electrodes, respectively. The electrons and the holes recombine to generate excitons. As excitons relax from an excited state to a ground state, light is emitted.

Typically, in an OLED display device, a pixel-defining layer is disposed on and surrounds edges of each of the pixel electrodes to form a boundary between pixels. A spacer for maintaining a distance between a substrate and an encapsulation layer may be disposed on the pixel-defining layer. When the pixel-defining layer and the spacer are made of different materials, the number of masks and processing steps are increased. Accordingly, there is a need for an approach that efficiently and cost-effectively enables an OLED to be fabricated with improved productivity.

The above information disclosed in this section is only for understanding the background of the inventive concepts, and, therefore, may contain information that does not form prior art.

SUMMARY

Some exemplary embodiments provide an organic light-emitting diode (OLED) display device capable of being manufactured with a reduced number of masks and processing steps that may be facilitated via the use of a transflective mask (e.g., a halftone mask and/or a slit mask).

Some exemplary embodiments provide a method of fabricating an OLED display device with a reduced number of masks and processing steps that may be facilitated via the use of a transflective mask (e.g., a halftone mask and/or a slit mask).

Additional aspects will be set forth in the detailed description which follows, and, in part, will be apparent from the disclosure, or may be learned by practice of the inventive concepts.

According to some exemplary embodiments, an OLED display device includes a pixel electrode, a pixel-defining layer, an organic emission layer, and a counter electrode. The pixel-defining layer includes an opening partially exposing the pixel electrode. The organic emission layer is disposed on the pixel electrode. The organic emission layer is disposed in the opening. The counter electrode is disposed on the organic emission layer. The counter electrode opposes the pixel electrode. The pixel-defining layer includes a first pixel-defining layer and a second pixel-defining layer. The first pixel-defining layer is disposed on the pixel electrode and includes an inorganic material. The second pixel-defining layer is disposed on the first pixel-defining layer and includes an organic material. A sidewall of the first pixel-defining layer that is closest to the opening is aligned with a sidewall of the second pixel-defining layer that is closest to the opening.

In some exemplary embodiments, the second pixel-defining layer may include a bank, and spacer protruding from the bank in a thickness direction.

In some exemplary embodiments, a shape of the spacer may be one of a truncated pyramid, a prism, a truncated cone, a cylinder, a hemisphere, and a half-oblate.

In some exemplary embodiments, the first pixel-defining layer may be a single layer structure or a multiple layer structure, and the inorganic material may include at least one of a silicon oxide layer ($SiO_2$), a silicon nitride layer (SiNx), and a silicon oxynitride layer ($SiO_2Nx$).

In some exemplary embodiments, the organic material may include at least one of benzocyclobutene, polyimide, polyamide, acrylic resin, and phenolic resin.

In some exemplary embodiments, the OLED display device may further include an encapsulation substrate on the counter electrode. The encapsulation substrate may include at least one inorganic encapsulation layer and at least one organic encapsulation layer.

According to some exemplary embodiments, an OLED display device includes a first electrode, a pixel-defining layer, an organic emission layer, and a second electrode. The pixel-defining layer includes an opening partially exposing the first electrode. The organic emission layer is disposed on the first electrode. The organic emission layer is disposed in the opening. The second electrode is disposed on the organic emission layer such that organic emission layer is between the second electrode and the first electrode. The pixel-defining layer includes a first pixel-defining layer and a second pixel-defining layer. The first pixel-defining layer is disposed on the first electrode and includes an inorganic material. The second pixel-defining layer is disposed on the first pixel-defining layer and includes an organic material. The first pixel-defining layer includes a first sidewall closest to the opening, and the second pixel-defining layer includes a second sidewall closest to the opening. The first pixel-defining layer includes a first area and a second area. The first area overlaps with the second pixel-defining layer in a thickness direction. The second area protrudes from the second sidewall of the second pixel-defining layer. The second area does not overlap with the second pixel-defining layer in the thickness direction. An average thickness of the second area of the first pixel-defining layer is smaller than an average thickness of the first area.

In some exemplary embodiments, a thickness of the second area of the first pixel-defining layer may decrease toward the first sidewall from a portion aligned with the second sidewall.

In some exemplary embodiments, the first sidewall may overlap with the first electrode in the thickness direction, and the second sidewall may not overlap with the first electrode in the thickness direction.

In some exemplary embodiments, the second pixel-defining layer may include a bank, and a spacer protruding from the bank in the thickness direction.

In some exemplary embodiments, the bank and the spacer may overlap the first area in the thickness direction.

In some exemplary embodiments, the second pixel-defining layer may further include a third sidewall of the spacer, and the second sidewall may be aligned with the third sidewall.

In some exemplary embodiments, the OLED display device may further include an encapsulation substrate. The encapsulation substrate may include at least one inorganic encapsulation layer and at least one organic encapsulation layer.

According to some exemplary embodiments, a method of fabricating an OLED display device includes: stacking an inorganic material layer on a substrate on which a first electrode is formed; forming an organic layer pattern on the inorganic material layer, the organic layer pattern including: a first part having a first thickness, a second part having a second thickness greater than the first thickness, and an opening partially exposing the inorganic material layer, the opening partially overlapping with the first electrode; and etching the inorganic material layer exposed by the organic layer pattern.

In some exemplary embodiments, the organic layer pattern may further include a third part between the second part and the opening, and the third part may have an average thickness smaller than the second thickness.

In some exemplary embodiments, a thickness of the third part may decrease from a boundary with the second part toward the opening.

In some exemplary embodiments, the etching of the inorganic material layer may be performed via dry-etching the inorganic material layer.

In some exemplary embodiments, the etching of the inorganic material layer may include etching an organic material together with the inorganic material such that the organic material is downsized to form the organic layer pattern.

In some exemplary embodiments, the organic layer pattern may include at least one of benzocyclobutene, polyimide, polyamide, acrylic resin, and phenolic resin.

In some exemplary embodiments, forming the organic layer pattern may include: positioning a transflective mask over the inorganic material layer, the transflective mask including a transmissive portion, a transflective portion having a lower transmittance than the transmissive portion, and a light-blocking portion; and performing an exposure and development process using the transflective mask.

According to various exemplary embodiments, a number of masks and processing steps to fabricate an OLED display device can be reduced. As such, productivity can be improved and manufacturing costs can be reduced.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
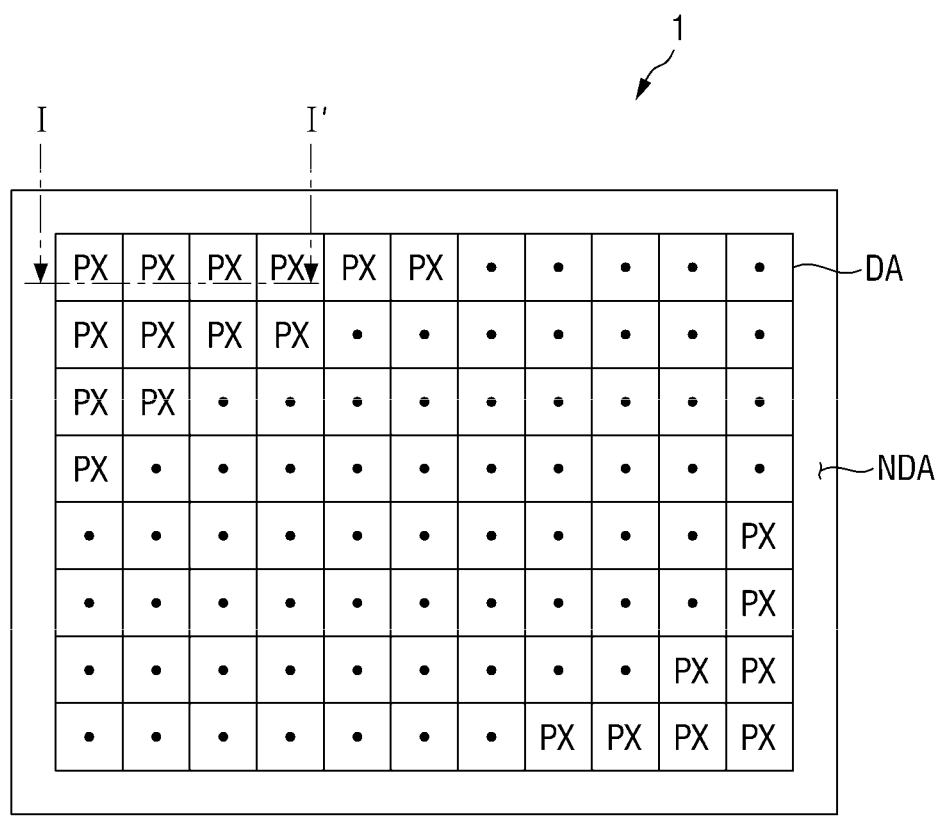
FIG. 1 is a view showing an organic light-emitting diode (OLED) display device according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the D1-axis, the D2-axis, and the D3-axis are not limited to three axes of a rectangular coordinate system, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to cross-sectional views, isometric views, perspective views, plan views, and/or exploded illustrations that are schematic illustrations of idealized exemplary embodiments and/or intermediate structures. As such, variations from the shapes of the illustrations as a result of, for example, manufacturing techniques and/or tolerances, are to be expected. Thus, exemplary embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

Hereinafter, various exemplary embodiments will be explained in detail with reference to the accompanying drawings.

FIG. 1 is a view showing an organic light-emitting diode (OLED) display device according to some exemplary embodiments.

Referring to FIG. 1, an OLED display device 1 may include a display area DA and a non-display area NDA. The display area DA may be disposed in a central portion of the OLED display device 1, but exemplary embodiments are not limited thereto. The display area DA may include a plurality of pixels PX. Each of the pixels PX may emit light of a particular color. In some exemplary embodiments, the pixels PX may include a red pixel, a green pixel, and a blue pixel; however, any suitable color pixel may be utilized in association with exemplary embodiments.

The non-display area NDA may be disposed outside (e.g., around) the display area DA. The non-display area NDA may include a driver unit (not shown). The driver unit may provide electrical signals, such as a data signal and/or a scan signal, to component of the display area DA, such as the pixels PX.

Figure 2:
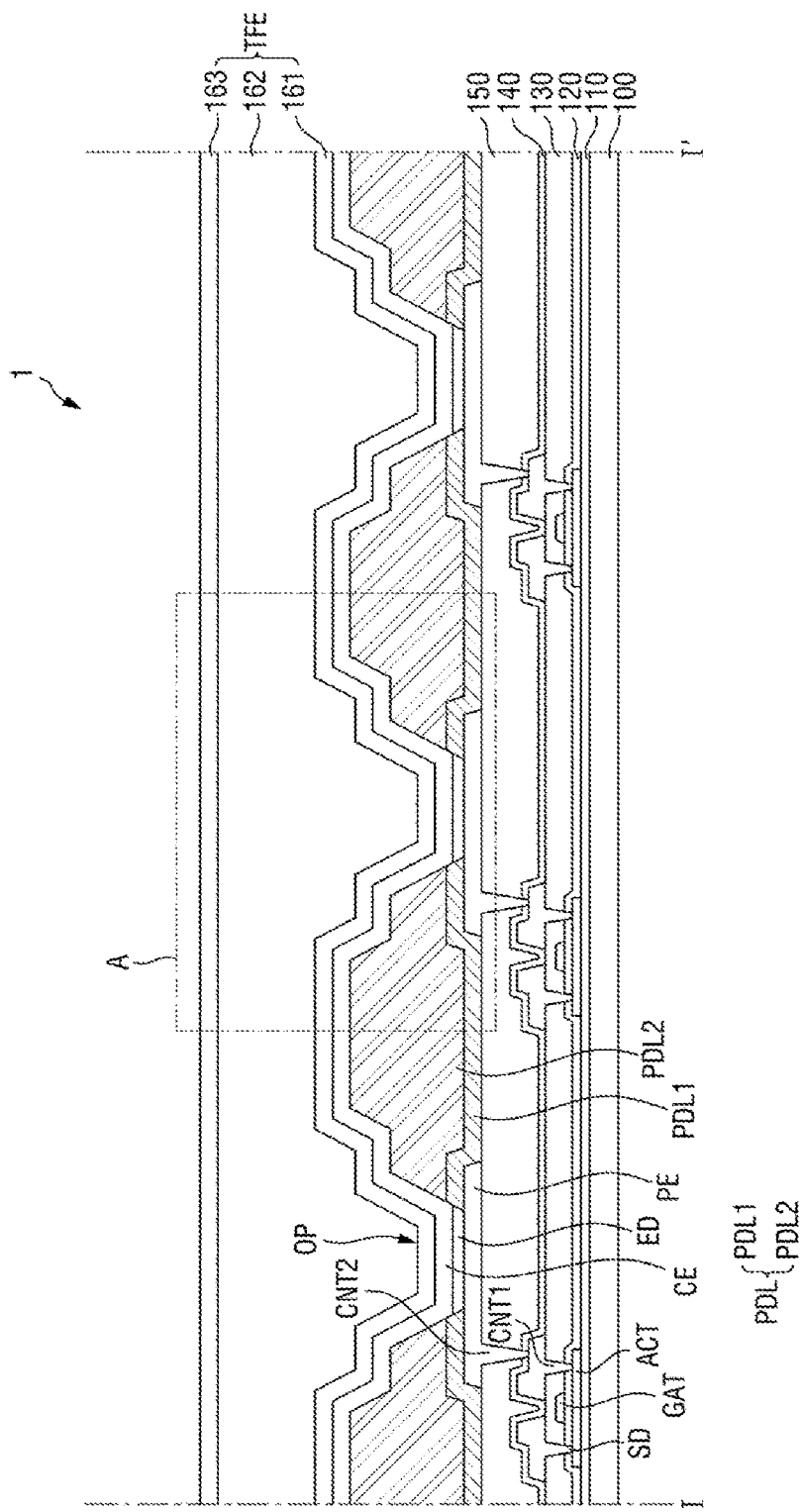
FIG. 2 is a cross-sectional view of the OLED display device taken along sectional line I-I' of FIG. 1 according to some exemplary embodiments.
Figure 3:
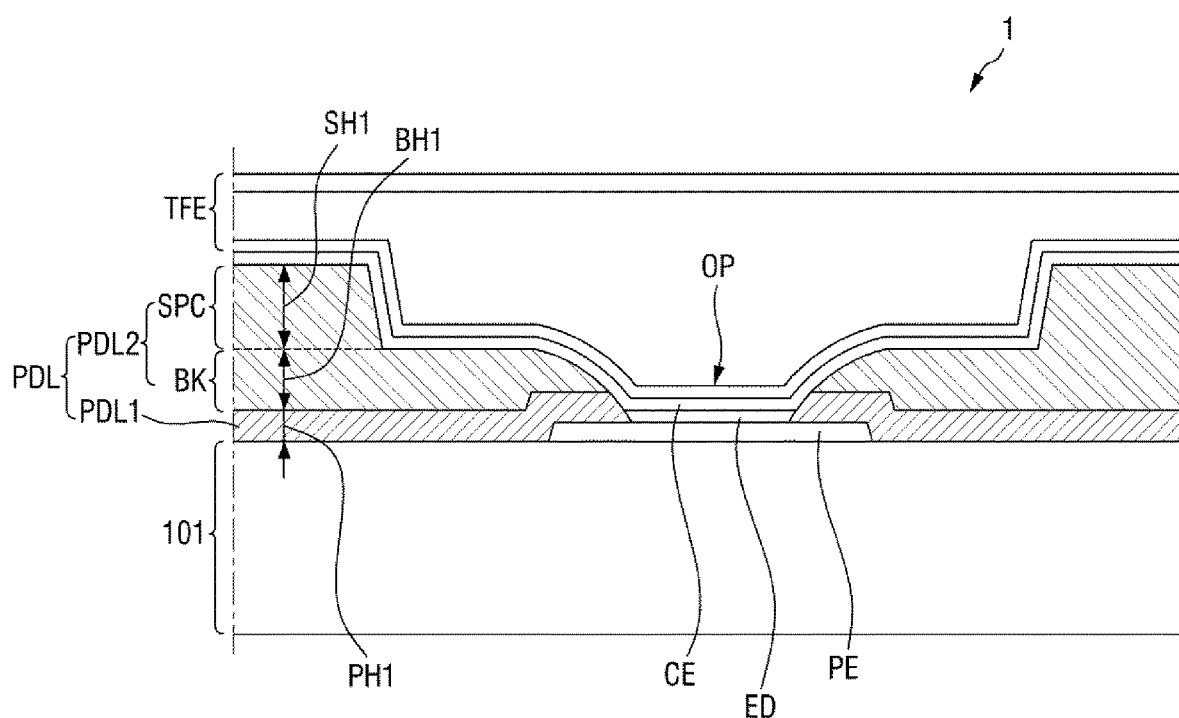
FIG. 3 is an enlarged view of area A of FIG. 2 according to some exemplary embodiments.

FIG. 2 is a cross-sectional view of the OLED display device taken along sectional line I-I' of FIG. 1 according to some exemplary embodiments. FIG. 3 is an enlarged view of area A of FIG. 2 according to some exemplary embodiments.

Referring to FIGS. 2 and 3, an OLED display device 1 may include: a substrate 100 including a pixel region and a transistor region; a buffer layer 110 disposed on the substrate 100; a semiconductor layer ACT disposed on (e.g., above) the buffer layer 110 in the transistor region; a gate electrode GAT insulated from the semiconductor layer ACT; a gate insulating layer 120 that insulates the semiconductor layer ACT from the gate electrode GAT; an interlayer dielectric layer 130 disposed on (e.g., over) the gate electrode GAT; a source/drain electrode SD insulated from the gate electrode GAT and electrically connected to the semiconductor layer ACT through a contact hole CNT1; a planarization layer 150 disposed on (e.g., above) the source/drain electrode SD; a first (e.g., pixel) electrode PE disposed on the planarization layer 150 and electrically connected to the source/drain electrode SD; and a first pixel-defining layer PDL1 formed on (e.g., over) the first electrode PE and having an opening OP for exposing a portion of the first electrode PE to the outside to define the pixel region. For illustrative convenience, those components disposed between and including the planarization layer 150 and substrate 100 are illustrated as substrate structure 101 in FIG. 3.

The substrate 100 may be made of a transparent glass material composed mainly of silicon dioxide ($SiO_2$). The substrate 100 is not necessarily limited to the aforementioned material and may be formed of a transparent plastic material. A paste material for the substrate 100 may be an insulating organic material. The paste material may be an organic material selected from the group consisting of polyethersulfone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and cellulose acetate propionate (CAP). It is also contemplated that one or more of the aforementioned materials may be utilized in association with exemplary embodiments.

When the OLED display device 1 is a bottom-emission display device where light exits through the substrate 100, the substrate 100 is formed of a transparent material. On the other hand, when the OLED display device 1 is of a top-emission display device where light exits upward (such as away from substrate 100), the substrate 100 may not necessarily be formed of a transparent material. For instance, the substrate 100 may be made of metal. When the substrate 100 is made of metal, the metal may include, but is not limited to, one selected from the group consisting of: iron, chromium, manganese, nickel, titanium, molybdenum, and stainless steel (SUS), or one or more of the aforementioned materials. It is also contemplated that the substrate 100 may include carbon. The substrate 100 may be made of a metal foil.

A buffer layer 110 may be further formed on the substrate 100 to provide a flat and smooth surface and block the permeation of impurities. The buffer layer 110 may be a single layer of a silicon oxide film (SiOx), a silicon nitride film (SiNx), or a silicon oxynitride film ($SiO_2Nx$), or multiple layers thereof.

A semiconductor layer ACT is formed on the buffer layer 110. The semiconductor layer ACT may be made of silicon (Si), for instance, amorphous silicon (a-Si), or may be made of polysilicon (p-Si). Besides, the semiconductor layer ACT may be made of, but is not limited to, germanium (Ge), gallium phosphorus (GaP), gallium arsenide (GaAs), aluminum arsenic (AlAs), etc. In addition, the semiconductor layer ACT may be a silicon semiconductor layer formed by diffusing n-type impurities into an silicon-on-insulator (SOI) substrate at a, for instance, low concentration. In addition, the semiconductor layer ACT may be formed by doping a portion of the amorphous silicon with p-type or n-type impurities.

A gate insulating layer 120 covering the semiconductor layer ACT and insulating the semiconductor layer ACT from the gate electrode GAT is disposed on the semiconductor layer ACT. The gate insulating layer 120 may be a silicon oxide layer ($SiO_2$), a silicon nitride layer (SiNx), a silicon oxynitride layer ($SiO_2Nx$), or multiple layers thereof, similarly to the buffer layer 110. The gate insulating layer 120 may be formed of the same material as the buffer layer 110 or a different material from that of the buffer layer 110.

A gate electrode GAT is formed on the gate insulating layer 120. The gate electrode GAT may apply a gate signal to control the emission of a pixel PX. The gate electrode GAT may be a single layer of aluminum (Al) or an aluminum alloy, such as chrome-aluminum (Cr—Al), molybdenum-aluminum (Mo—Al), and aluminum-neodymium (Al—Nd), or may be made up of multiple layers of an aluminum alloy stacked on a chrome (Cr) or molybdenum (Mo) alloy. It is contemplated, however, that any other suitable conductive material may be utilized.

An interlayer dielectric layer 130 is formed over the gate electrode GAT. The interlayer dielectric layer 130 electrically insulates the gate electrode GAT from the source/drain electrode SD and may be made of a silicon oxide layer ($SiO_2$), a silicon nitride layer (SiNx), a silicon oxynitride ($SiO_2Nx$), or multiple layers thereof, similarly to the buffer layer 110.

The source/drain electrodes SD, which are electrically connected to the semiconductor layer ACT, are formed on the interlayer dielectric layer 130. The source/drain electrodes SD may be formed of at least one of molybdenum (Mo), chromium (Cr), tungsten (W), molybdenum-tungsten (MoW), aluminum (Al), aluminum-neodymium (Al—Nd), titanium (Ti), titanium nitride (TiN), copper (Cu), a molybdenum alloy (Mo alloy), and a copper alloy (Cu alloy). The source/drain electrodes SD are electrically connected by the semiconductor layer ACT to apply a voltage to a first electrode PE.

An additional insulating layer 140 may be further disposed above the source/drain electrodes SD. A planarization layer 150 may be disposed on the insulating layer 140 to provide a flat surface. As the material of the planarization layer 150, an organic acrylic material may be used; however, exemplary embodiments are not limited thereto.

The first electrode PE may be disposed on the planarization layer 150 and may be electrically connected to the source/drain electrodes SD. The first electrode PE may be connected to the source/drain electrodes SD via a contact hole CNT2 formed through the insulating layer 140 and the planarization layer 150. Therefore, a driving voltage may be applied from the source/drain electrodes SD to the first electrode PE.

The first electrode PE may be made of a transparent conductive material. For instance, the transparent conductive material may include at least one of indium tin oxide (ITO), indium zinc oxide (IZO), carbon nano tube, conductive polymer, and nanowire. That is to say, the first electrode PE may be formed of a mixture of more than one of the transparent conductive materials.

A first pixel-defining layer PDL1 defining a pixel region may be formed on the first electrode PE. The first pixel-defining layer PDL1 may be formed on the entire (or substantially entire) surface of the substrate 100 to cover the planarization layer 150. The first pixel-defining layer PDL1 has an opening OP for exposing a part of the first electrode PE to the outside to define a pixel region. For instance, the first pixel-defining layer PDL1 may be overlapped with some regions including the edge of the first electrode PE in the thickness direction, e.g., in a direction normal to the upper surface of the substrate 100. The first pixel-defining layer PDL1 may be made of an inorganic material, such as a silicon oxide layer ($SiO_2$), a silicon nitride layer (SiNx), and a silicon oxynitride layer ($SiO_2Nx$), or multiple layers thereof.

As described above, since the planarization layer 150 is formed of an organic material, outgassing may occur during subsequent manufacturing process(es), such as a firing process. The outgassing may oxidize a first intermediate layer that transports electrons, which will be described later. As a result, the pixel region may be reduced or otherwise compromised. That is to say, the lifetime of the OLED display device 1 can be shortened. According to some exemplary embodiments, when the first pixel-defining layer PDL1 is formed of an inorganic material disposed on the planarization layer 150, it is possible to prevent the outgassing from occurring outside the planarization layer 150. Accordingly, the reliability, optical characteristics, and lifetime deviations of the OLED display device 1 can be improved.

The OLED display device 1 may further include an organic emission layer ED on the first electrode PE in the pixel region, a second (e.g., counter) electrode CE on the organic emission layer ED, and an encapsulation substrate (or structure) TFE.

The first electrode PE may be an anode electrode or a cathode electrode of the organic emission layer ED. In the following description, it is assumed that the first electrode PE is the anode electrode and the second electrode CE is the cathode electrode. It is, however, to be understood that the first electrode PE may be a cathode electrode and the second electrode CE may be an anode electrode.

The first electrode PE used as the anode electrode may be made of a conductive material having a high work function. When the OLED display device 1 is of a bottom-emission display device, the first electrode PE may be made of a material such as ITO, IZO, zinc oxide (ZnO), and indium (III) oxide ($In_2O_3$), or a stack thereof. When the OLED display device 1 is a top-emission display device, the first electrode PE may further include a reflective layer made of a material, such as silver (Ag), magnesium (Mg), aluminum (Al), platinum (Pt), palladium (Pd), gold (Au), nickel (Ni), neodymium (Nd), iridium (Ir), chromium (Cr), lithium (Li), and calcium (Ca), or alloys including at least one of the aforementioned materials.

Although not shown in the drawings, a first intermediate layer may be formed on the first electrode PE exposed via the opening of the first pixel-defining layer PDL1. The first intermediate layer may facilitate the injection or transport of electrons or holes between the first electrode PE and the second electrode CE. When the first electrode PE is the anode electrode, the first intermediate layer may be a layer associated with injection or transport of holes. For example, the first intermediate layer may include a hole injection layer or a hole transport layer alone or may include a stack of a hole injection layer and a hole transport layer.

The hole injection layer may be formed of, for example, a phthalocyanine (Pc) compound, such as copper phthalocyanine (CuPc) or Tris(4-carbazoyl-9-ylphenyl)amine (TCTA), 4,4',4"-Tris[(3-methylphenyl)phenylamino]triphenylamine (m-MTDATA), and 1,3,5-tris[4-(3-methylphenylphenylamino)phenyl]benzene (m-MTDAPB), which are starburst type amines. Exemplary embodiments, however, are not limited to these materials.

The hole transport layer may be formed of at least one selected from the group consisting of: N,N'-bis(3-methylphenyl)-N,N'-diphenyl-[1,1-biphenyl]-4,4'-diamine (TPD) and N,N'-di(naphthalen-1-yl)-N,N'-diphenyl benzidine (α-NPD). Exemplary embodiments, however, are not limited to these materials.

The emission layer ED may be disposed on the first intermediate layer. The emission layer ED may be disposed to overlap with the first electrode PE within the opening OP of the first pixel-defining layer PDL1. The upper surface of the emission layer ED may be located lower than the upper surface of the first pixel-defining layer PDL1. That is to say, the upper surface of the first pixel-defining layer PDL1 may protrude upward from the emission layer ED, or in other words, the upper surface of the first pixel-defining layer PDL1 may be further away from substrate 100 than the upper surface of the emission layer ED.

The emission layer ED may be formed of a polymer organic material or a small molecular organic material that emits one of red, green, or blue light, or a mixture of the polymer/small molecular materials.

In some exemplary embodiments, the emission layer ED may contain a host material and a dopant material. Examples of the host material include, but are not limited to: tris(8-hydroxyquinolinato)aluminum (Alq3); 9,10-di(naphth-2-yl) anthracene (AND); 3-tert-butyl-9,10-di(naphth-2-yl)anthracene (TBADN); 4,4'-bis(2,2-diphenyl-ethen-1-yl) -4,4'-dimethylphenyl (DPVBi); 4,4'-bis(2,2-diphenyl-ethen-1-yl)-4,4'-dimethylphenyl (p-DMDPVBi); tert (9,9-diarylfluorene)s (TDAF); 2-(9,9'-spirobifluoren-2-yl) -9,9'-spirobifluorene (BSDF); 2,7-bis(9,9'-spirobifluoren-2-yl)-9,9'-spirobifluorene (TSDF); bis(9,9-diarylfluorene)s (BDAF); 4,4'-bis (2,2-diphenyl-ethen-1-yl)-4, 4'-di-(tert-butyl) phenyl (p-TDPVBi); 1,3-bis(carbazol-9-yl) benzene (mCP); 1,3,5-tris(carbazol-9-yl) benzene (tCP); 4,4', 4"-tris (carbazol-9-yl) triphenylamine (TcTa); 4,4'-bis (carbazol-9-yl) biphenyl (CBP); 4,4'-bis(9-carbazolyl)-2,2'-dimethyl-biphenyl (CBDP); 4,4'-bis(carbazol-9-yl) -9,9-dimethyl-fluorene (DMFL-CBP); 4,4'-bis(carbazol-9-yl)-9,9-bis(9-phenyl-9H-carbazol) fluorene (FL-4CBP); 4,4'-bis (carbazol-9-yl)-9,9-di-tolyl-fluorene (DPFL-CBP); 9,9-bis (9-phenyl-9H-carbazole) fluorene (FL-2CBP), etc.

Examples of the dopant material include, but are not limited to: 4,4'-bis[4-(di-p-tolylamino)styryl]biphenyl (DPAVBi), 9,10-di(naphth-2-yl)anthracene (ADN), 3-tert-butyl-9,10-di(naphth-2-yl)anthracene (TBADN), and the like.

A second pixel-defining layer PDL2 may be disposed on the upper surface of the first pixel-defining layer PDL1. The second pixel-defining layer PDL2 may overlap the first pixel-defining layer PDL1. That is to say, some regions including the edge of the pixel electrode PE, the first pixel-defining layer PDL1, and the second pixel-defining layer PDL2 may overlap with one another in the thickness direction. The second pixel-defining layer PDL2 is not formed in the opening OP of the first pixel-defining layer PDL1 and accordingly the emission layer ED is not covered by the second pixel-defining layer PDL2, but is exposed.

A sidewall of the first pixel-defining layer PDL1 that is closer to the opening OP may be aligned with the sidewall of the second pixel-defining layer PDL2 that is closer to the opening OP. The thickness of the first pixel-defining layer PDL1 may be constant. The second pixel-defining layer PDL2 may include a bank BK and a spacer SPC protruding from the bank BK in the thickness direction.

The second pixel-defining layer PDL2 may be made of at least one organic material selected from the group consisting of benzocyclobutene (BCB), polyimide (PI), polyamide (PA), acrylic resin, and phenolic resin.

The bank BK and the spacer SPC of the second pixel-defining layer PDL2 may be integrally formed via a photolithography process using a photosensitive material. In other words, the bank BK and the spacer SPC of the second pixel-defining layer PDL2 may be made of the same material as one another.

For example, by adjusting the amount of light via a transflective exposure process using, for example, a halftone mask or a slit mask, it is possible to form the bank BK and the spacer SPC of the second pixel-defining layer PDL2 together. It is, however, to be understood that exemplary embodiments are not limited thereto. The bank BK and the spacer SPC of the second pixel-defining layer PDL2 may be formed sequentially or separately, and may be made of different materials than one another. The spacer SPC is formed on the spacing between adjacent pixel electrodes PE, and may have a shape of a truncated pyramid, a prism, a truncated cone, a cylinder, a hemisphere, and a half-oblate.

Although not shown in the drawings, a second intermediate layer may be formed on the exposed organic emission layer ED. The second intermediate layer may facilitate the injection or transport of electrons or holes between the first electrode PE and the second electrode CE. When the second electrode CE is the cathode electrode, the second intermediate layer may be a layer associated with injection or transport of electrons. For example, the second intermediate layer may include an electron injection layer or an electron transport layer alone or may include a stack of an electron injection layer and an electron transport layer.

The electron transport layer may be formed of a material such as Alq3. The electron injection layer may be formed of a material such as lithium fluoride (LiF), sodium chloride (NaCl), cesium fluoride (CsF), lithium oxide ($Li_2O$), barium oxide (BaO), and 8-Hydroxyquinolinolato-lithium (Liq).

The second electrode CE is formed on the second pixel-defining layer PDL2. When the second electrode CE is used as the cathode electrode, it may be made of a conductive material having a low work function. The second electrode CE may be formed of Ag, Mg, Al, Pt, Pd, Au, Ni, Nd, Ir, Cr, Li, or Ca, or alloys including at least one of the aforementioned materials.

The encapsulation substrate TFE may be disposed on the second electrode CE. The encapsulation substrate TFE encapsulates the organic emission layer ED to prevent impurities, such as moisture and air, from permeating from the outside of the OLED display device 1 to damage or deform the organic emission layer ED. In some exemplary embodiments, the encapsulation substrate TFE may be a thin encapsulation layer that includes one or more inorganic encapsulation layers 161 and 163 and one or more organic encapsulation layers 162. The inorganic encapsulation layers 161 and 163 and the organic encapsulation layer 162 may be alternately disposed. For example, the encapsulation substrate TFE may include a first inorganic encapsulation layer 161 disposed on the second electrode CE, an organic encapsulation layer 162 disposed on the first inorganic encapsulation layer 161, and a second inorganic encapsulation layer 163 disposed on the organic encapsulation layer 162. Although FIG. 2 illustrates the encapsulation substrate TFE being made up of three layers, this is merely illustrative. In some exemplary embodiments, the encapsulation substrate TFE may further include a siloxane-based encapsulant layer, such as hexamethyldisiloxane (HMDSO).

In the following description, like reference numerals may denote features analogous to those described in the above-described exemplary embodiments. In addition, a redundant description will be omitted and description will be made focusing on differences than those elements previously described.

Figure 4:
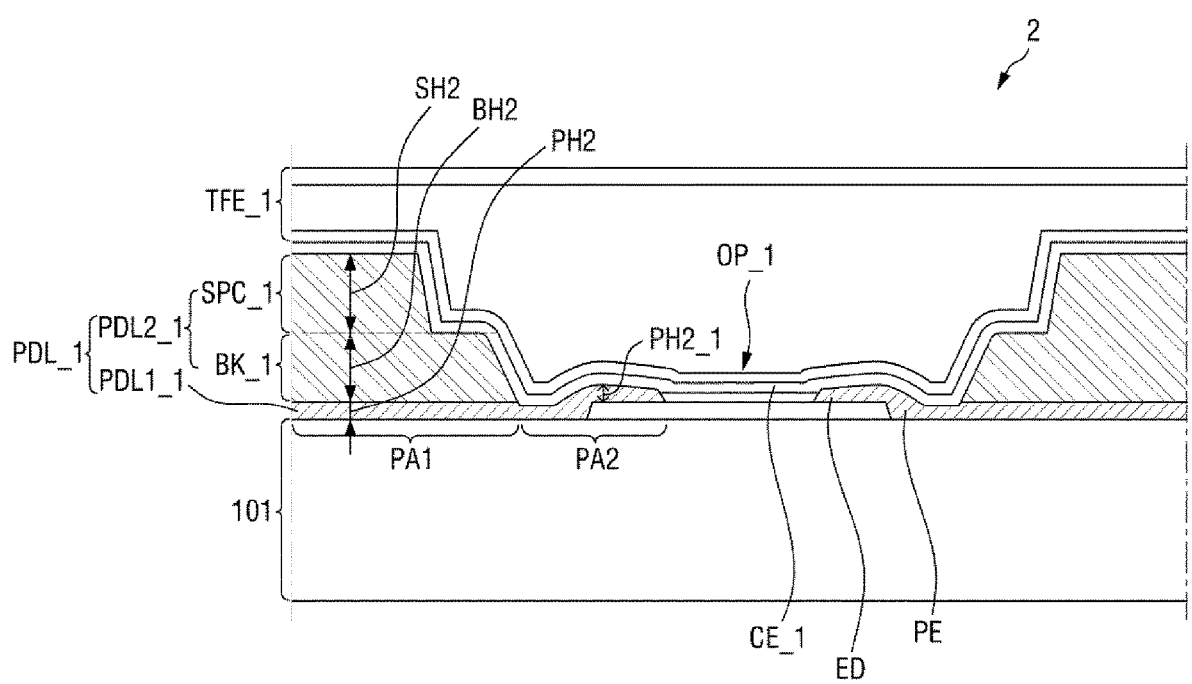
FIG. 4 is an enlarged view of a portion (e.g., a counterpart of area A of FIG. 2) of an OLED display device according to some exemplary embodiments.

FIG. 4 is an enlarged view of a portion (e.g., a counterpart of area A of FIG. 2) of an OLED display device according to some exemplary embodiments.

The OLED display device 2 shown in FIG. 4 is different from the OLED display device 1 of FIGS. 2 and 3 in that the sidewall of a bank part BK_1 that is closer to an opening OP_1 is not in line with the sidewall of a first pixel-defining layer PDL1_1 that is closer to the opening OP_1. For instance, the OLED display device 2 may include a first electrode PE, a pixel-defining layer PDL_1 defining an opening OP_1 for partially exposing the first electrode PE, an organic emission layer ED disposed on the first electrode PE in the opening OP_1 of the pixel-defining layer PDL_1, and a second electrode CE_1 disposed on the organic emission layer ED.

The pixel-defining layer PDL_1 may include a first pixel-defining layer PDL1_1 disposed on the first electrode PE and containing an inorganic material, and a second pixel-defining layer PDL2 disposed on the first pixel-defining layer PDL1 and containing an organic material. The first pixel-defining layer PDL1_1 may include a first sidewall closer to the opening OP_1, and the second pixel-defining layer PDL2_1 may include a second sidewall closer to the opening OP_1. That is to say, the first sidewall may overlap with the first electrode PE in the thickness direction, whereas the second sidewall may not overlap with the first electrode PE.

The first pixel-defining layer PDL1_1 may include a first area PA1 overlapping with the second pixel-defining layer PDL2_1 in the thickness direction, and a second area PA2 protruding from the second sidewall of the second pixel-defining layer PDL2_1 and not overlapping with the second pixel-defining layer PDL2_1 in the thickness direction. The average thickness PH2_1 of the second area PA2 of the first pixel-defining layer PDL1_1 may be smaller than the average thickness PH2 of the first area PA1. That is to say, the thickness of the second area PA2 of the first pixel-defining layer PDL1_1 may decrease from the part in line with the second sidewall toward the first sidewall. According to a method of fabricating an OLED display device to be described later, the second area PA2 of the first pixel-defining layer PDL1_1 may be exposed longer during, for instance, a dry etch process from the part aligned with the second sidewall toward the first sidewall.

In addition, the height BH2 of the bank BK_1 and the height SH2 of the spacer SPC_1 of the second pixel-defining layer PDL2_1 may be smaller than the heights BH1 of the bank BK and the height SH1 of the spacer SPC shown in FIG. 3, respectively. According to a method of fabricating an OLED display device to be described later, the upper surface of the bank BK_1 and the upper surface of the spacer SPC_1 of the second pixel-defining layer PDL2_1 may be exposed longer during, for instance, a dry etch process than the upper surface of the bank BK and the upper surface of the spacer SPC shown in FIG. 3, respectively.

Figure 5:
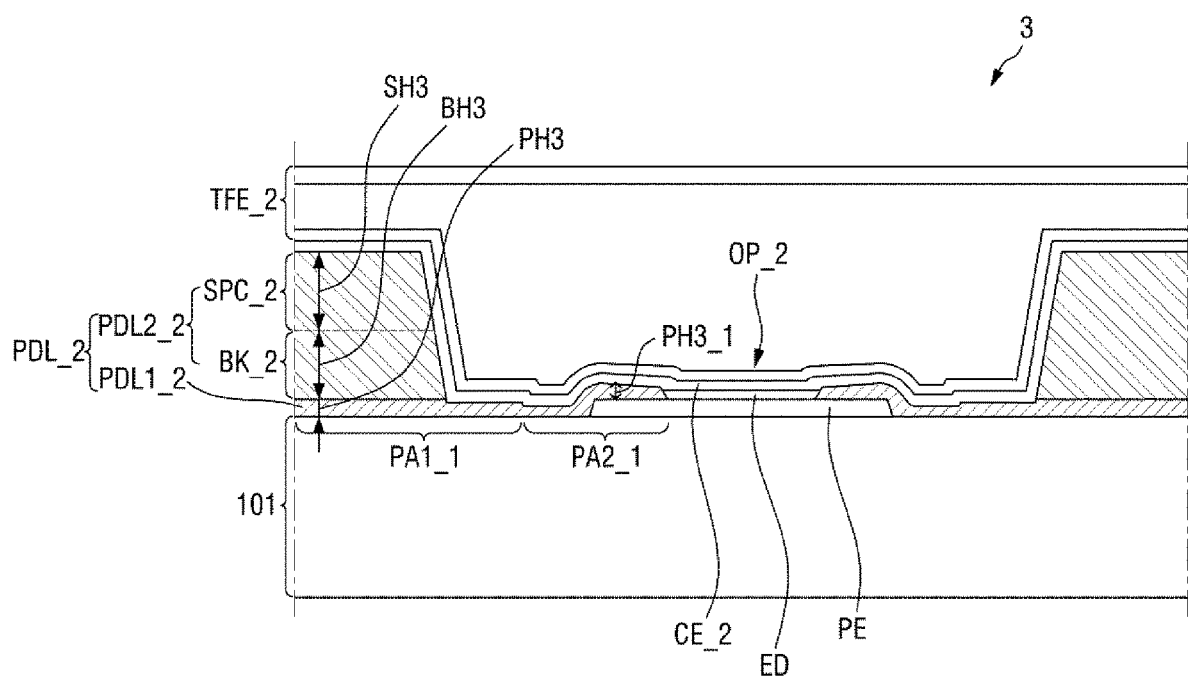
FIG. 5 is an enlarged view of a portion (e.g., a counterpart of area A of FIG. 2) of an OLED display device according to some exemplary embodiments.

FIG. 5 is an enlarged view of a portion (e.g., a counterpart of area A of FIG. 2) of an OLED display device according to some exemplary embodiments.

Referring to FIG. 5, a bank BK_2 of the second pixel-defining layer PDL2_2 of the pixel-defining layer PDL_2 is different from as described in association with FIG. 4 in that the bank BK_2 is disposed only in the region overlapping with the spacer SPC_2 in the thickness direction. For instance, the OLED display device 3 may include a first electrode PE, a pixel-defining layer PDL_2 defining an opening OP_2 for partially exposing the first electrode PE, an organic emission layer ED disposed on the first electrode PE in the opening OP_2 of the pixel-defining layer PDL_2, and a second electrode CE_2 disposed on the organic emission layer ED.

The pixel-defining layer PDL_2 may include a first pixel-defining layer PDL1_2 disposed on the first electrode PE and containing an inorganic material, and a second pixel-defining layer PDL2_2 disposed on the first pixel-defining layer PDL1_2 and containing an organic material. The first pixel-defining layer PDL1_2 may include a third sidewall closer to the opening OP_2. The second pixel-defining layer PDL2_2 may include a spacer SPC_2 and a bank BK_2 overlapping with the spacer SPC_2 in the thickness direction and may include a fourth sidewall closer to the opening OP_2. That is to say, the third sidewall may overlap with the first electrode PE in the thickness direction, whereas the fourth sidewall may not overlap with the first electrode PE.

The first pixel-defining layer PDL1_2 may include a first area PA1_1 overlapping with the spacer SPC_2 in the thickness direction, and a second area PA2_1 not overlapping with the spacer SPC_2 in the thickness direction.

The average thickness PH3_1 of the second area PA2_1 of the first pixel-defining layer PDL1_2 may be smaller than the average thickness PH3 of the first area PA1_1. That is to say, the thickness of the second area PA2_1 of the first pixel-defining layer PDL1_2 may decrease from the part in line with the fourth sidewall of the spacer SPC_2 toward the third sidewall. According to a method of fabricating an OLED display device to be described later, the second area PA2_1 of the first pixel-defining layer PDL1_2 may be exposed longer during, for instance, a dry etch process from the part aligned with the fourth sidewall toward the second sidewall.

In addition, the height BH3 of the bank BK_2 and the height SH3 of the spacer SPC_2 of the second pixel-defining layer PDL2_2 may be smaller than the heights BH2 of the bank BK_1 and the height SH2 of the spacer SPC_1 shown in FIG. 4, respectively. According to a method of fabricating an OLED display device to be described later, the upper surface of the spacer SPC_2 of the second pixel-defining layer PDL2_2 may be exposed longer during, for instance, a dry etch process than the upper surface of the spacer SPC_1 shown in FIG. 4.

Figure 6:
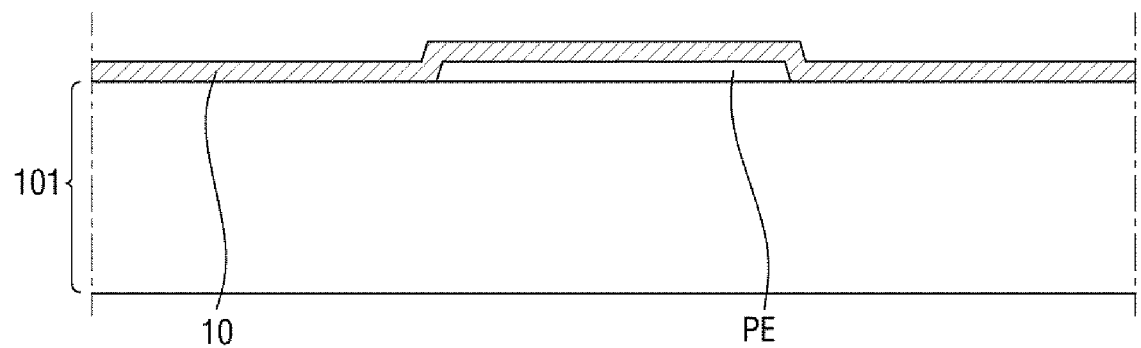
FIGS. 6 to 8 are cross-sectional views of an OLED display device at various stages of manufacture according to some exemplary embodiments.
Figure 7:
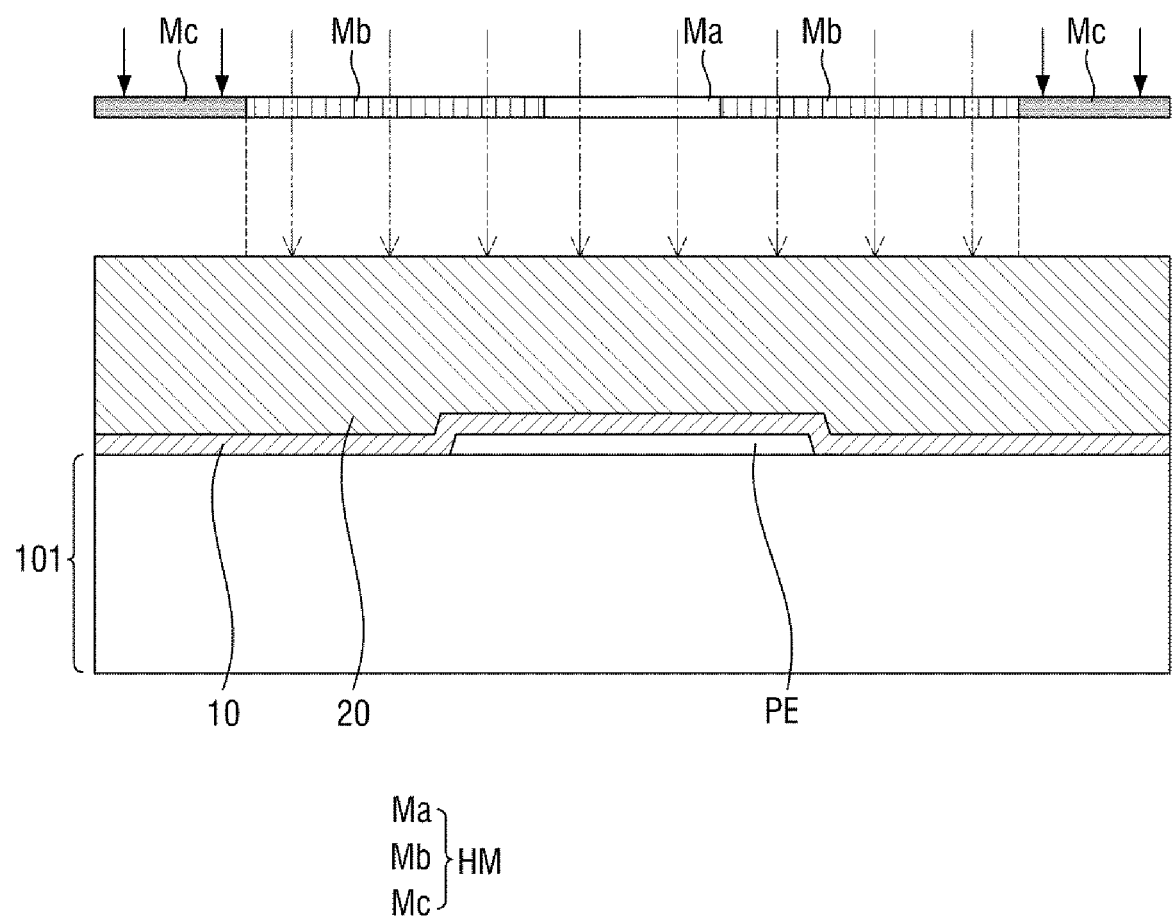
Figure 8:
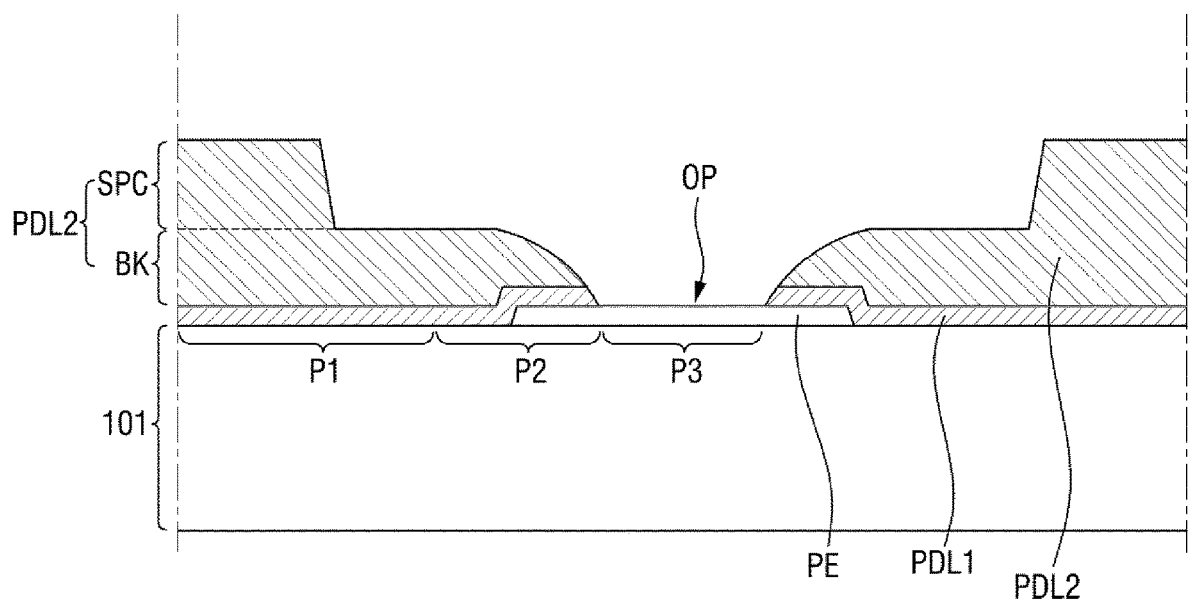

Hereinafter, a method of fabricating the above-described OLED display device will be described. FIGS. 6 to 8 are cross-sectional views of an OLED display device at various stages of manufacture according to some exemplary embodiments.

Referring to FIGS. 6 to 8, processing steps of a method of fabricating an OLED display device according to some exemplary embodiments may include sequentially stacking an inorganic material layer 10 on a substrate structure 101 on which a first electrode PE is formed, sequentially stacking an organic material layer 20 on the inorganic material layer 10, forming an organic pattern including a first part P1 having a first thickness on the inorganic material layer 10 and a second part P2 having a second thickness (which may be larger than the first thickness) and including an opening OP partially overlapping with the first electrode PE in a third part P3, the opening OP exposing the inorganic material layer 10, and etching the inorganic material layer 10 exposed via the organic pattern.

As shown in FIG. 6, an inorganic material layer 10 is formed on a substrate structure 101 on which a first electrode PE is formed. The inorganic material layer 10 may be made of, for example, a silicon oxide layer ($SiO_2$), a silicon nitride layer (SiNx), and a silicon oxynitride layer ($SiO_2Nx$), or multiple layers thereof.

Although not shown in the drawings for convenience of illustration, referring to FIG. 2, the substrate structure 101 may at least include a buffer layer 110, a semiconductor layer ACT disposed above the buffer layer 110 in the transistor region, a gate electrode GAT insulated from the semiconductor layer ACT, a gate insulating layer 120 insulating the semiconductor layer ACT from the gate electrode GAT, an interlayer dielectric layer 130 above the gate electrode GAT, source/drain electrodes SD insulated from the gate electrode GAT and electrically connected to the semiconductor layer ACT through a contact hole CNT1, and a planarization layer 150 disposed on the source/drain electrodes SD. The first electrode PE disposed on the planarization layer 150 may be electrically connected to the source/drain electrodes SD via a contact hole CNT2.

As shown in FIG. 7, an organic material layer 20 is formed on the inorganic material layer 10. The organic material layer 20 may be a photosensitive organic layer. The organic material layer 20 may be made of, for example, at least one organic material selected from the group consisting of benzocyclobutene (BCB), polyimide (PI), polyamide (PA), acrylic resin, and phenolic resin.

A transflective exposure process may be carried out using, for example, a halftone mask or a slit mask. In the following description, a photosensitive organic material layer 20 is formed using a photosensitive layer containing a positive photosensitive material. It is, however, to be understood that exemplary embodiments are not limited thereto. In some exemplary embodiments, the photosensitive organic material layer 20 may be formed using a photosensitive layer containing a negative photosensitive material. The photosensitive organic material layer 20 and the inorganic material layer 10 are exposed to light using the halftone mask HM or the slit mask with portions having different transmittances, such that there is a region where the photosensitive organic material layer 20 and the inorganic material layer 10 are removed, a region where the photosensitive organic material layer 20 remains to form the bank BK of the second pixel-defining layer PDL2, and a region where the photosensitive organic material layer 20 remains to form the spacer SPC of the second pixel-defining layer PDL2.

According to some exemplary embodiments, the halftone mask HM or the slit mask may include a first transmissive portion Ma that transmits a first amount (e.g., 100%) of light, a second transmissive portion Mb that transmits a second amount (e.g., approximately half of the first amount) of the light, and a third transmissive portion Mc that transmits a third amount (e.g., barely transmits) of the light. The halftone mask HM or the slit mask are placed such that the first transmissive portion Ma is aligned with where the organic material layer 20 and the inorganic material layer 10 are to be removed, the second transmissive portion Mb is aligned with where the organic material layer 20 remains and the bank BK of the second pixel-defining layer PDL2 is to be formed, and the third transmissive portion Mc is aligned with where the organic material layer 20 remains and the spacer SPC of the second pixel-defining layer PDL2 is to be formed, and the exposure process is carried out.

Under the first transmissive portion Ma that transmits, for instance, 100% of light, the photosensitive organic material layer 20 is removed by development so that the inorganic material layer 10 thereunder is exposed. Under the third transmissive portion Mc that blocks, for instance, 100% of the light, the photosensitive organic material layer 20 remains intact so that the spacer SPC of the second pixel-defining layer PDL2 is formed. Under the second transmissive portion Mb that transmits, for instance, approximately half the light, approximately half the photosensitive organic material layer 20 remains such that the bank BK of the second pixel-defining layer PDL2 is formed.

By etching (e.g., etching out) the underlying inorganic material layer 10 exposed through the patterned photosensitive organic material layer, the first electrode PE can be exposed. As a result, the sidewall of the first pixel-defining layer PDL1 that is closer to the opening OP may be aligned with the sidewall of the second pixel-defining layer PDL2 that is closer to the opening OP, as shown in FIG. 8.

In some exemplary embodiments, the process of etching the patterned photosensitive organic material layer may include etching out the photosensitive organic material layer 20, as well as the inorganic material layer 10. When a material having a low etch selectivity to the inorganic material layer 10 and the photosensitive organic material layer 20 is used as an etchant, the photosensitive organic material layer 20 and the inorganic material layer 10 can be etched together via the etching process. The etching rate for the inorganic material layer 10, which is the main etching target, may be, but is not limited to being, higher than the etching rate for the photosensitive organic material layer 20.

Although the inorganic material layer 10 exposed by the photosensitive organic material layer 20 is etched by the etchant, the photosensitive organic material layer 20 may be etched back so that it may be generally downsized and thinned. In the vicinity of the opening OP, which is the corner of the downsizing, the photosensitive organic material layer 20 is etched inward, and accordingly, the photosensitive organic material layer 20 may be etched more near the opening OP. Therefore, the thickness of the photosensitive organic material layer 20 may be smallest near the opening OP and become larger away from the opening OP.

In some exemplary embodiments, the overall thickness of the second pixel-defining layer PDL2 may be the largest at the portion where the spacer SPC overlaps with the bank BK and may be the smallest at the sidewall of the bank BK that is closer to the opening OP. In some exemplary embodiments, the thickness of the second pixel-defining layer PDL2 may decrease toward the sidewall closer to the opening OP from the portion where the spacer SPC is disposed.

According to various exemplary embodiments, by placing the halftone mask HM above the photosensitive organic material layer 20, which may replace a photoresist layer and performing the exposure process, the second pixel-defining layer PDL2 including the organic material can be formed on the first pixel-defining layer PDL1 including the inorganic material via a single mask process. As such, it is possible to reduce the number of the mask processes from twice to once, and to eliminate the process of ashing or stripping the photoresist layer.

In the following description, like reference numerals may denote features analogous to those previously described. In addition, a redundant description will be omitted and description will be made focusing on differences.

Figure 9:
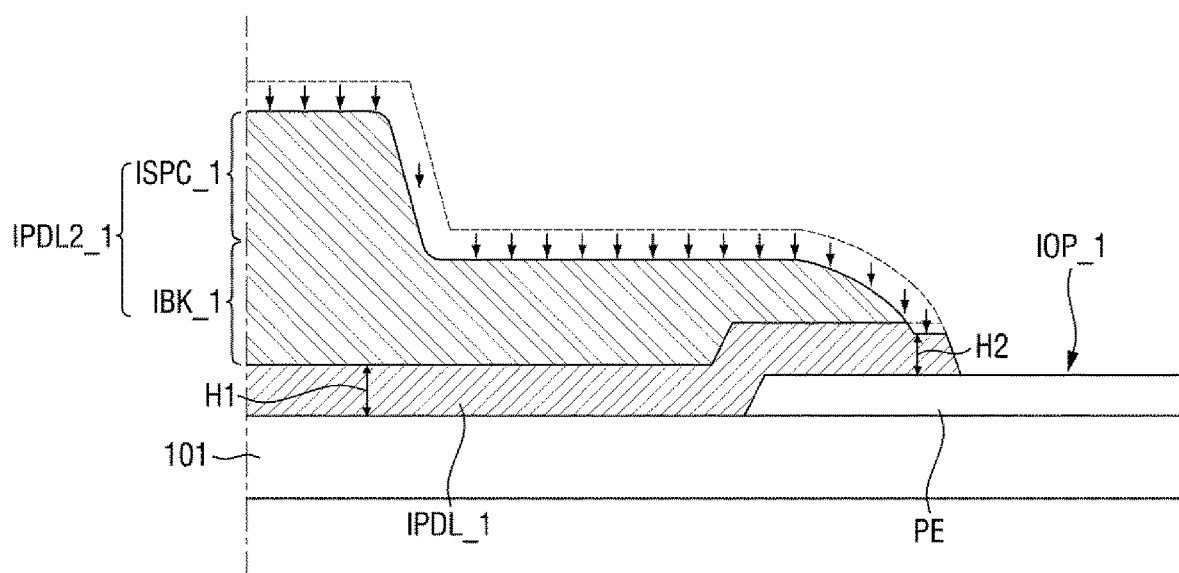
FIGS. 9 and 10 are cross-sectional views of an OLED display device at various stages of manufacture according to some exemplary embodiments.
Figure 10:
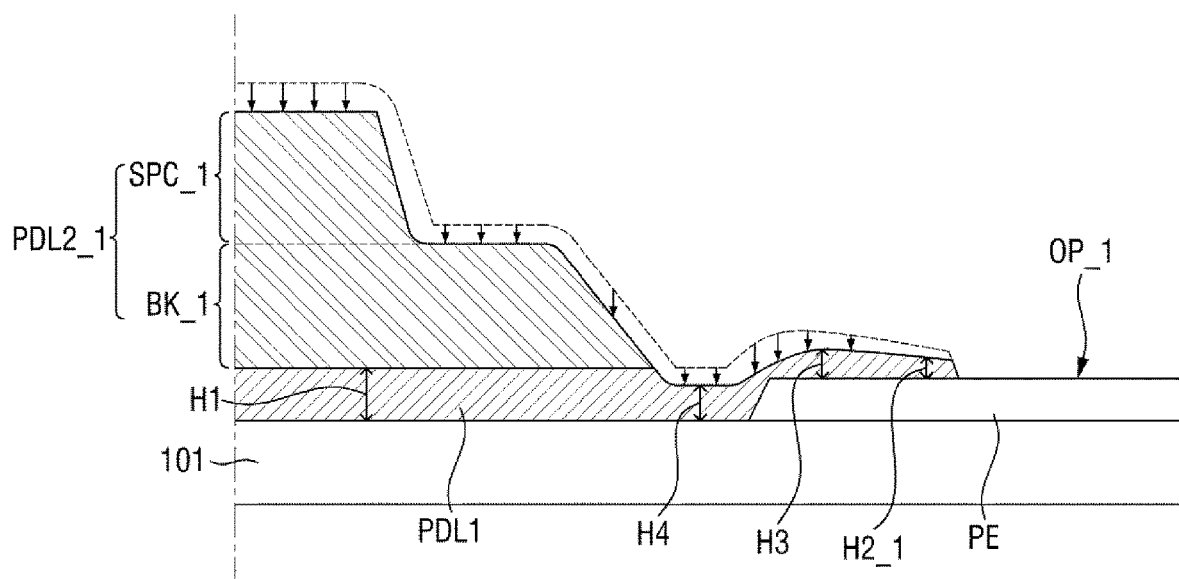

FIGS. 9 and 10 are cross-sectional views of an OLED display device at various stages of manufacture according to some exemplary embodiments.

FIGS. 9 and 10 are cross-sectional views for illustrating some of the processing steps of a method of fabricating an OLED display device 2 shown in FIG. 4. This method is different from the method described in association with FIGS. 6 to 8 in that an additional etching process is carried out after the etching process of FIG. 8.

For example, the processes substantially identical to those described above with reference to FIGS. 6 to 8 are carried out, i.e., using a transflective mask to form the first pixel-defining layer PDL1 and the second pixel-defining layer PLD2 aligned with each other, and then an etching process is further carried out on the first pixel-defining layer PDL1 and the second pixel-defining layer PDL2.

According to some exemplary embodiments, an etching process of selectively removing the first pixel-defining layer PDL1 disposed on the substrate structure 101 and the edge of the first electrode PE through the pattern of the second pixel-defining layer PDL2 after the process of FIG. 8. The etching process may be carried out using the same material as the etchant used in the etching process of FIG. 8. That is to say, by using a material having a low etch selectivity to the inorganic material layer 10 and the photosensitive organic material layer 20 as the etchant, the photosensitive organic material layer 20, as well as the inorganic material layer 10 can be etched via the etching process. It is, however, to be understood that exemplary embodiments are not limited thereto. In this process, an etchant having an etch selectivity different from that of the etchant of FIG. 8 may also be used.

As mentioned earlier, after the process shown in FIG. 8, the thickness of the second pixel-defining layer PDL2 decreases toward the sidewall closer to the opening OP from the portion where the spacer SPC is disposed. Accordingly, the thinner the second pixel-defining layer PDL2 disposed on the upper surface of the first electrode PE, the more the first pixel-defining layer PDL1 is etched.

Referring to FIG. 9, in the early stage of the etching process, the portion of the first pixel-defining layer PDL1 that is closer to the opening OP and is covered by the thinnest portion of the second pixel-defining layer PDL2 may be exposed to form an intermediate first pixel-defining layer IPDL1_1. Accordingly, the thickness H2 of the exposed portion of the intermediate first pixel-defining layer IPDL1_1 that is closer to the intermediate opening IOP_1 may be smaller than the thickness H1 of the intermediate first pixel-defining layer IPDL1_1 overlapping with the intermediate spacer ISPC_1 of an intermediate, second pixel-defining layer IPDL2_1 in the thickness direction. By performing the etching process, the thickness of the intermediate second pixel-defining layer IPDL2_1 may also be reduced generally, e.g., gradually reduced. In this manner, an intermediate bank IBK_1 is also formed.

Referring to FIG. 10, as the etching process proceeds, the intermediate second pixel-defining layer IPDL2_1 may be etched back and downsized to form the second pixel-defining layer PDL2_1 including the spacer SPC_1 and the bank BK_1.

Accordingly, the second pixel-defining layer PDL2_1 may be removed in proportion to the thickness, and the exposed portion of the intermediate first pixel-defining layer IPDL_1 may also be enlarged. The intermediate first and second pixel-defining layers IPDL1_1 and IPDL2_1 are exposed longer toward the intermediate opening IOP_1 of the intermediate first pixel-defining layer IPDL_1 from the intermediate bank IBK_1 of the intermediate second pixel-defining layer IPDL2_1 to form the first pixel-defining layer PDL1_1 and the second pixel-defining layer PDL2_1 and the opening OP_1. That is to say, the thicknesses of each of the first pixel-defining layer PDL1_1 and the second pixel-defining layer PDL2_1 may generally decrease toward the opening OP_1 of the first pixel-defining layer PDL_1 from the bank BK_1 of the second pixel-defining layer PDL2_1. Accordingly, the relative thickness of the first pixel-defining layer PDL_1 may be as follows and as shown in FIG. 10: the thickness H1 of the portion overlapping with the second pixel-defining layer PDL2_1>the thickness H4 of the portion closer to the sidewall of the bank BK_1>the thickness H3 of the portion overlapping with the edge of the first electrode PE>the thickness H2_1 of the portion closer to the sidewall of the opening OP_1.

It is to be understood that although the process of FIG. 9 is separately carried out after the process of FIG. 8 according to some exemplary embodiments, these processes may be carried out continuously.

Figure 11:
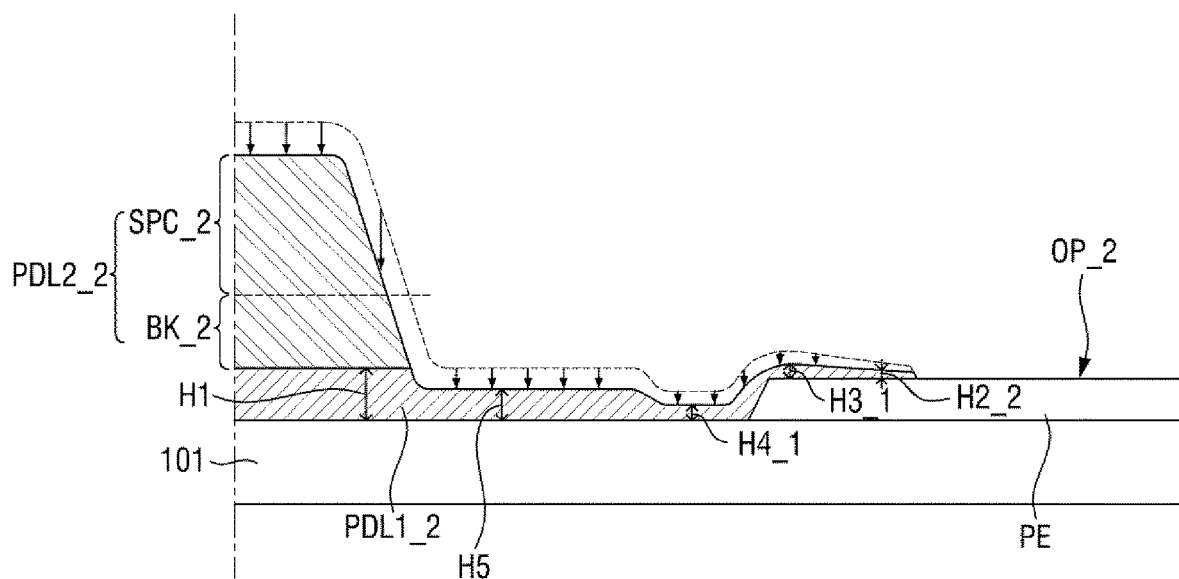
FIG. 11 is a cross-sectional view of an OLED display device at a stage of manufacture according to some exemplary embodiments.

FIG. 11 is a cross-sectional view of an OLED display device at a stage of manufacture according to some exemplary embodiments.

FIG. 11 shows a cross-sectional view of some processing steps of a method of fabricating the OLED display device 3 shown in FIG. 5. This method is different from the method described above with reference to FIGS. 9 and 10 in that an additional etching process is carried out after the etching process of FIG. 10.

According to some exemplary embodiments, an etching process of selectively removing the first pixel-defining layer PDL1_1 disposed on the substrate structure 101 and the edge of the first electrode PE through the pattern of the second pixel-defining layer PDL2_1 after the process of FIG. 10 to form the first pixel-defining layer PDL2_1, the second pixel-defining layer PDL2_2, and the opening OP_2. The etching process may be carried out using the same material as the etchant used in the etching process of FIGS. 9 and 10. That is to say, by using a material having a low etch selectivity to the inorganic material layer 10 and the photosensitive organic material layer 20 as the etchant, the photosensitive organic material layer 20, as well as the inorganic material layer 10 can be etched via the etching process. It is, however, to be understood that exemplary embodiments are not limited thereto. In this process, an etchant having an etch selectivity different from that of the etchant of FIGS. 9 and 10 may be used.

In some exemplary embodiments, as the etching process is further carried out after the process of FIG. 10, the second pixel-defining layer PDL2_1 may be etched back and down-sized to form the second pixel-defining layer PDL2_2 including the spacer SPC_2 and the bank BK_2. Accordingly, the second pixel-defining layer PDL2_2 may be removed sequentially in proportion to the thickness, and the first pixel-defining layer PDL_1 may be exposed partially and patterned to form the first pixel-defining layer PDL2_1. For instance, a portion of the first pixel-defining layer PDL1_1 under the second pixel-defining layer PDL2_1 having a small thickness is exposed first, and then a portion of the first pixel-defining layer PDL1_1 under the second pixel-defining layer PDL2_1 having a larger thickness is exposed such that the first pixel-defining layer PDL1_2 and the second pixel-defining layer PDL2_2 are formed. Since the thickness of the second pixel-defining layer PDL2_2 of FIG. 11 before the etching becomes smaller from the bank BK_2 toward the opening OP_2, the underlying first pixel-defining layer PDL1_2 is exposed longer from the bank BK_2 of the pixel-defining layer PDL2_2 toward the opening OP_2 of the first pixel-defining layer PDL1_2. That is to say, the thicknesses of each of the first pixel-defining layer PDL1_2 and the second pixel-defining layer PDL2_2 may generally decrease toward the opening OP_2 of the first pixel-defining layer PDL1_2 from the bank BK_2 of the second pixel-defining layer PDL2_2.

Accordingly, the relative thickness of the first pixel-defining layer PDL1_2 may be as follows and as shown in FIG. 11: the thickness H1 of the portion overlapping with the second pixel-defining layer PDL2_2>the thickness H5 of the portion closer to the sidewall of the bank BK_2>the thickness H4_1 of the portion closer to the edge of the first electrode PE>the thickness H3_1 of the portion overlapping with the edge of the first electrode PE>the thickness H2_2 of the portion closer to the sidewall of the opening OP_2.

By performing the etching process sufficiently, the portion of the second pixel-defining layer PDL2_2 including only the relatively thin bank BK_2 may be completely removed, whereas the portion of the second pixel-defining layer PDL2_2 including the relatively thick spacer SPC_2 may remain. The remaining portion of the second pixel-defining layer PDL2_2 may include the bank BK_2 and the spacer SPC_2 thereon whose thickness is reduced. The sidewall of one end of the remaining bank BK_2 may be aligned with the sidewall of one end of the spacer SPC_2.

It is to be understood that although the process of FIG. 11 is separately carried out after the process of FIG. 10 according to some exemplary embodiments, these processes may be carried out continuously.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. An organic light-emitting diode (OLED) display device comprising:
 a pixel electrode;
 a pixel-defining layer comprising an opening partially exposing the pixel electrode;
 an organic emission layer disposed on the pixel electrode, the organic emission layer being disposed in the opening; and
 a counter electrode disposed on the organic emission layer, the counter electrode opposing the pixel electrode,
 wherein the pixel-defining layer comprises:
  a first pixel-defining layer disposed on the pixel electrode, the first pixel-defining layer comprising an inorganic material; and
  a second pixel-defining layer disposed on the first pixel-defining layer, the second pixel-defining layer comprising an organic material, and
 wherein:
  a sidewall of the first pixel-defining layer that is closest to the opening is aligned with a sidewall of the second pixel-defining layer that is closest to the opening; and the sidewall of the first pixel-defining layer that is closest to the opening is closer to the opening than the sidewall of the second pixel-defining layer that is closest to the opening.

2. The OLED display device of claim 1, wherein:
the first pixel-defining layer is a single layer structure or a multiple layer structure; and
the inorganic material comprises at least one of a silicon oxide layer ($SiO_2$), a silicon nitride layer (SiNx), and a silicon oxynitride layer ($SiO_2Nx$).

3. The OLED display device of claim 1, wherein the organic material comprises at least one of benzocyclobutene, polyimide, polyamide, acrylic resin, and phenolic resin.

4. The OLED display device of claim 1, further comprising:
an encapsulation substrate on the counter electrode,
wherein the encapsulation substrate comprises at least one inorganic encapsulation layer and at least one organic encapsulation layer.

5. The OLED display device of claim 1, wherein the second pixel-defining layer comprises:
a bank; and
a spacer protruding from the bank in a thickness direction.

6. The OLED display device of claim 5, wherein a shape of the spacer is one of a truncated pyramid, a prism, a truncated cone, a cylinder, a hemisphere, and a half-oblate.

7. An organic light-emitting diode (OLED) display device comprising:
a first electrode;
a pixel-defining layer comprising an opening partially exposing the first electrode;
an organic emission layer disposed on the first electrode, the organic emission layer being disposed in the opening; and
a second electrode disposed on the organic emission layer such that organic emission layer is between the second electrode and the first electrode,
wherein the pixel-defining layer comprises:
a first pixel-defining layer disposed on the first electrode, the first pixel-defining layer comprising an inorganic material; and
a second pixel-defining layer disposed on the first pixel-defining layer, the second pixel-defining layer comprising an organic material,
wherein the first pixel-defining layer comprises a first sidewall closest to the opening,
wherein the second pixel-defining layer comprises a second sidewall closest to the opening,
wherein the first pixel-defining layer comprises:
a first area overlapping with the second pixel-defining layer in a thickness direction; and
a second area protruding from the second sidewall of the second pixel-defining layer, the second area not overlapping with the second pixel-defining layer in the thickness direction, and
wherein an average thickness of the second area of the first pixel-defining layer is smaller than an average thickness of the first area.

8. The OLED display device of claim 7, wherein a thickness of the second area of the first pixel-defining layer decreases toward the first sidewall from a portion aligned with the second sidewall.

9. The OLED display device of claim 7, wherein:
the first sidewall overlaps with the first electrode in the thickness direction; and
the second sidewall does not overlap with the first electrode in the thickness direction.

10. The OLED display device of claim 7, further comprising:
an encapsulation substrate,
wherein the encapsulation substrate comprises at least one inorganic encapsulation layer and at least one organic encapsulation layer.

11. The OLED display device of claim 7, wherein the second pixel-defining layer comprises:
a bank; and
a spacer protruding from the bank in the thickness direction.

12. The OLED display device of claim 11, wherein the bank and the spacer overlap the first area in the thickness direction.

13. The OLED display device of claim 11, wherein:
the second pixel-defining layer further comprises a third sidewall of the spacer; and
the second sidewall is aligned with the third sidewall.

14. A method of fabricating an organic light-emitting diode (OLED) display device, the method comprising:
stacking an inorganic material layer on a substrate on which a first electrode is formed;
forming an organic layer pattern on the inorganic material layer, the organic layer pattern comprising:
a first part having a first thickness,
a second part having a second thickness greater than the first thickness, and
an opening partially exposing the inorganic material layer, the opening partially overlapping with the first electrode; and
etching the inorganic material layer exposed by the organic layer pattern.

15. The method of claim 14, wherein:
the organic layer pattern further comprises a third part between the second part and the opening; and
the third part has an average thickness smaller than the second thickness.

16. The method of claim 15, wherein a thickness of the third part decreases from a boundary with the second part toward the opening.

17. The method of claim 14, wherein the etching of the inorganic material layer is performed via dry-etching the inorganic material layer.

18. The method of claim 14, wherein the etching of the inorganic material layer comprises etching an organic material together with the inorganic material such that the organic material is downsized to form the organic layer pattern.

19. The method of claim 14, wherein the organic layer pattern comprises at least one of benzocyclobutene, polyimide, polyamide, acrylic resin, and phenolic resin.

20. The method of claim 14, wherein forming the organic layer pattern comprises:
positioning a transflective mask over the inorganic material layer, the transflective mask comprising a transmissive portion, a transflective portion having a lower transmittance than the transmissive portion, and a light-blocking portion; and
performing an exposure and development process using the transflective mask.

* * * * *